United States Patent
Pan et al.

(10) Patent No.: US 12,243,890 B2
(45) Date of Patent: Mar. 4, 2025

(54) SEMICONDUCTOR DEVICE STRUCTURE AND MANUFACTURING PROCESS THEREOF

(71) Applicant: Taiwan Semiconductor Manufacturing Company, Ltd., Hsinchu (TW)

(72) Inventors: Yi-Ping Pan, Taipei (TW); Hung-Jen Hsu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 534 days.

(21) Appl. No.: 17/577,020

(22) Filed: Jan. 17, 2022

(65) Prior Publication Data

US 2022/0139988 A1    May 5, 2022

Related U.S. Application Data

(63) Continuation of application No. 16/595,502, filed on Oct. 8, 2019, now Pat. No. 11,227,887, which is a continuation of application No. 15/256,628, filed on Sep. 5, 2016, now Pat. No. 10,475,835.

(51) Int. Cl.
   *H01L 27/146* (2006.01)

(52) U.S. Cl.
   CPC .... *H01L 27/14625* (2013.01); *H01L 27/1462* (2013.01); *H01L 27/14636* (2013.01); *H01L 27/14685* (2013.01)

(58) Field of Classification Search
   CPC ........... H01L 27/14625; H01L 27/1462; H01L 27/14636; H01L 27/14685
   See application file for complete search history.

(56) References Cited

U.S. PATENT DOCUMENTS

| | | | |
|---|---|---|---|
| 2010/0096718 A1* | 4/2010 | Hynecek | H01L 27/1464 257/460 |
| 2012/0281292 A1* | 11/2012 | Baca | G02B 1/113 977/773 |
| 2016/0370505 A1* | 12/2016 | Koo | H01L 27/14625 |

* cited by examiner

*Primary Examiner* — Julia Slutsker
(74) *Attorney, Agent, or Firm* — JCIPRNET

(57) ABSTRACT

A semiconductor device structure for sensing an incident light includes a substrate, a passivation layer and a wiring structure. The substrate has a device embedded therein. The passivation layer is disposed on the substrate, where the passivation layer has a first side and a second side opposite to the first side, the first side of the passivation layer includes microstructures disposed on the substrate, and the second side of the passivation layer is a continuous flat plane, wherein each of the microstructures has a cross-section in a shape of a triangle, trapezoid or arc. The wiring structure is disposed on the substrate, where the writing structure includes at least one contact and metal interconnection patterns respectively formed in different dielectric layers, and the at least one contact and the metal interconnection patterns are electrically connected, where the substrate is located between the passivation layer and the wiring structure.

20 Claims, 7 Drawing Sheets

SEMICONDUCTOR DEVICE STRUCTURE AND MANUFACTURING PROCESS THEREOF

CROSS-REFERENCE TO RELATED APPLICATION

This application is a continuation application of and claims the priority benefit of a prior application Ser. No. 16/595,502, filed on Oct. 8, 2019. The prior application Ser. No. 16/595,502 is a continuation application of and claims the priority benefit of a prior application Ser. No. 15/256,628, filed on Sep. 5, 2016, now allowed. The entirety of each of the above-mentioned patent applications is hereby incorporated by reference herein and made a part of this specification.

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV), digital video recorder (DVR), optical sensor (proximity sensor, ambient light sensor heart rate sensor, and optical sensing element (optical transceiver) applications. These semiconductor image sensors utilize single or an array of image/optical signal sensor elements, each image/optical signal sensor element including a photodiode and other elements, to absorb light and convert the sensed light into digital data or electrical signals. Thus, it is important for semiconductor image sensors to be able to have good light absorption abilities.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
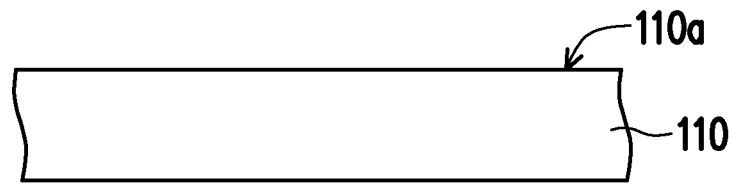
FIG. 1 to FIG. 6 are schematic cross sectional views of various stages in a manufacturing process of a semiconductor device structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 6 are schematic cross sectional views of various stages in a manufacturing process of a semiconductor device structure according to some exemplary embodiments of the present disclosure. Referring to FIG. 1, in some embodiments, a substrate 110 is provided. The substrate 110 includes a surface 110a. The substrate 110 is, for example, a semiconductor substrate. The substrate 110 may include, for example, silicon, strained silicon, silicon alloy, silicon carbide, silicon-germanium, silicon-germanium carbide, germanium, a germanium alloy, germanium-arsenic, indium-arsenic, group III-V semiconductors, organic plastic substrates, glass or a combination thereof. In some embodiments, the substrate 110 may be a wafer and may include doped regions, such as p-type regions, n-type regions or a combination thereof.

Figure 2:
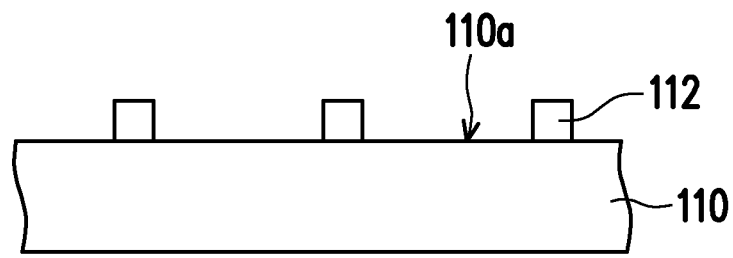

Referring to FIG. 2, one or more devices 112 may be formed at the surface 110a of the substrate 110. The devices 112 may be, for example, light sensing devices. In some embodiments, the devices 112 are formed in the substrate 110 (not shown). In FIG. 2, the devices 112 are shown to be formed on the surface 110a of the substrate 110. In other embodiments, the devices 112 are not on the surface 110a, but are formed in the substrate 110, and do not protrude out of the substrate. The devices 112 may include, for example, a pixel, a single-photon avalanche diode (SPAD), a photo diode (PD), a photo transistor, a time of flight (ToF) camera, a photo gate, a pinned photo diode, or a combination thereof.

In some embodiments, additional semiconductor devices with different functions or integrated circuits may also be included on the substrate 110 or in the substrate 110. The scope of the disclosure is not limited to the embodiments or drawings described therein. Furthermore, the structure may only require one light sensing device 112 or an array of multiple light sensing devices 112. The number of light sensing devices 112 or configuration of multiple light sensing devices 112 may be adjusted according to user requirements.

Figure 3:
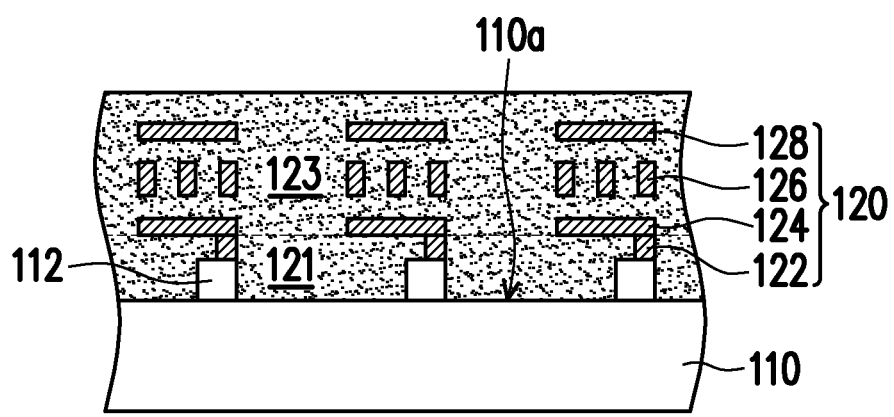

Referring to FIG. 3, in some embodiments, a wiring structure 120 is formed on the surface 110a of the substrate 110. In certain embodiments, the wiring structure 120 includes one or more contacts 122 connected to the devices 112 and metal interconnection patterns 124, 126, 128. In some embodiments, the contact(s) 122 is formed within the dielectric layer 121, and the metal interconnection patterns 124, 126, 128 are fabricated with one or more interlayer dielectric layers 123. In some embodiments, the dielectric layer 121 may include a pre-metal dielectric layer, and the dielectric layer 123 may include one or more inter dielectric layers. The materials of the metal interconnection patterns 124, 126, 128 include, for example, aluminum, copper, copper alloys or any other suitable metal materials. The wiring structure 120 including the dielectric layers 121, 123, the contact(s) 122 and the metal interconnection patterns 124, 126, 128 may be formed in the back end of line processes.

Figure 4:
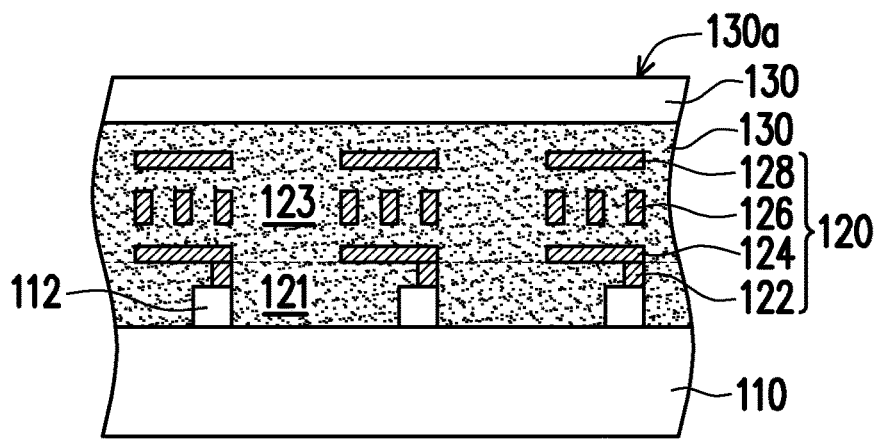
Figure 14:
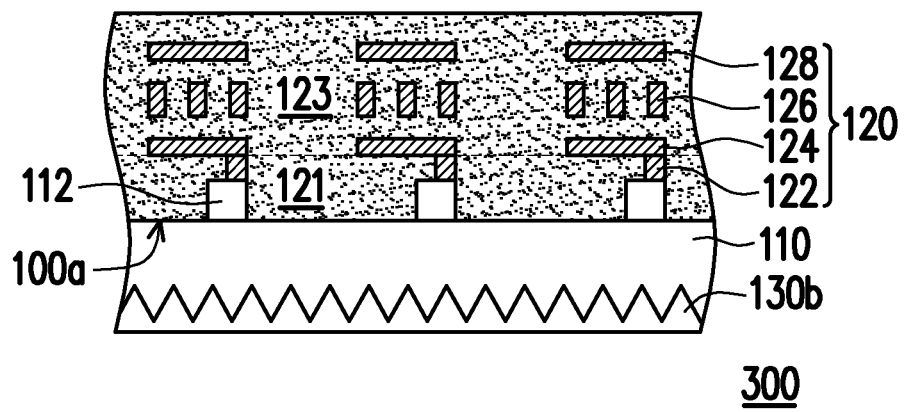
FIG. 14 is a schematic cross section view of a semiconductor device structure according to some exemplary embodiments of the present disclosure.
Figure 15:
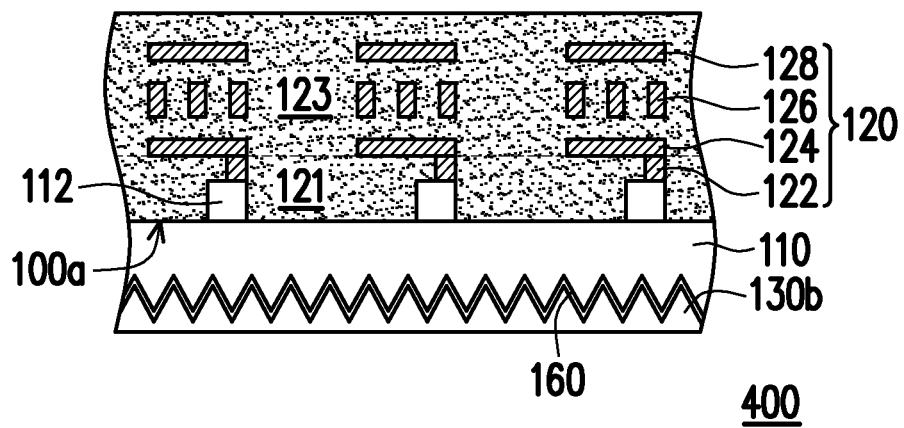
FIG. 15 is a schematic cross section view of a semiconductor device structure according to some exemplary embodiments of the present disclosure.

Referring to FIG. 4, a passivation layer 130 is formed on the wiring structure 120. The passivation layer 130 having a top surface 130a is deposited over the wiring structure 120. In some embodiments, the material of the passivation layer 130 includes, for example, silicon carbide (SiC), SiCN, silicon nitride, silicon oxynitride, silicon oxide, a low-k dielectric material or combinations thereof, but is not limited by the above-mentioned materials. In some embodiments, the material of the passivation layer 130 is light transmissive, with an index of refraction greater than or equal to 2.0. The material of the passivation layer 130 may be selected according to the requirements or design of the products. In other embodiments, the passivation layer 130 is formed on a backside surface of the substrate 110 opposite to the surface 110a, see a semiconductor device 300 of FIG. 14 and a semiconductor device 400 of FIG. 15.

Figure 5:
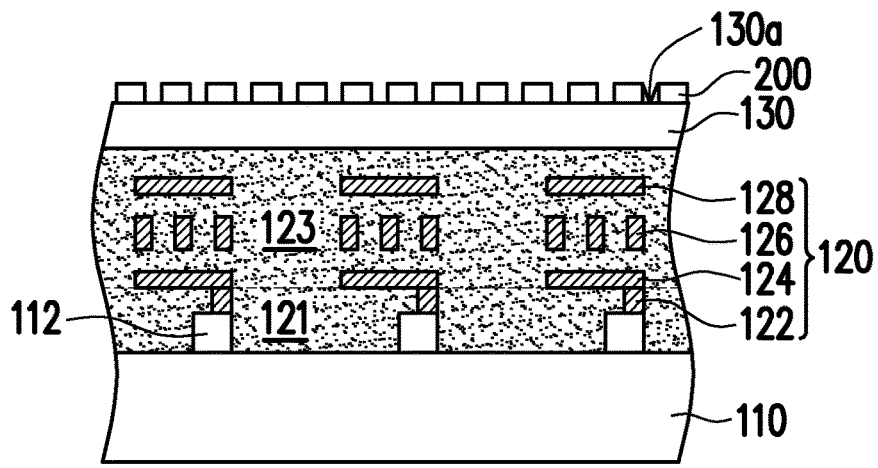
Figure 6:
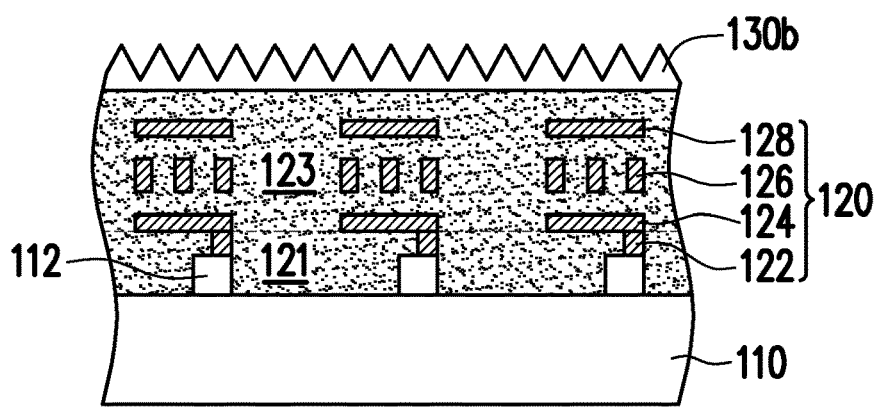

Referring to FIG. 5 and FIG. 6, in certain embodiments, a photolithography process and an etching process are performed towards the passivation layer 130 to form a plurality of microstructures 130b. In some embodiments, a photoresist pattern 200 formed on the surface 130a of the passivation layer 130. In some embodiments, the photoresist pattern 200 is formed by forming a photoresist layer through spin coating and then patterning by projecting light through a photo mask (not shown).

Referring to FIG. 6, in some embodiments, using the photoresist pattern 200 as the mask, the etching process is performed to remove a portion of the passivation layer 130 from the passivation layer 130 so as to form the microstructures 130b. In some examples, performing the etching process includes performing at least one dry etching process and/or a wet etching process. Herein, a semiconductor device structure 100 is formed. In some embodiments, the semiconductor device structure 100 includes one or more CMOS image sensor devices, which are able to sense incident light or signals. Of course, the semiconductor device structure 100 may include other suitable light sensor devices for sensing incident light at different wavelengths. Although in certain embodiments the etching process is performed to form the microstructures 130b as described above, the microstructures 130b may be formed using a laser ablation technique or even mechanical ablation technology in some other embodiments. In other embodiments, the passivation layer 130 formed on a backside surface of the substrate 110 opposite to the surface 110a (not shown) also performs the same steps in FIG. 5 and FIG. 6 to form the microstructures 130b. When formed on the backside surface, the structure may be suitable for backside illumination. When formed on the surface 110a of the substrate 110, the structure may be suitable for front side illumination.

Furthermore, in some embodiments, the microstructures 130b are formed to cover substantially the whole area of the passivation layer 130. In some embodiments, the semiconductor device structure 100 may further include an array of micro lens (not shown) disposed over the microstructures 130b. In other embodiments, the microstructures 130b are formed only at certain regions or sections of the passivation layer 130. In the case that the microstructures 130b formed are only at one or more regions of the passivation layer 130, the region(s) formed with the microstructures 130b is a light sensing region with light sensing devices below the light sensing region. That is to say, the microstructures 130b are located in the light sensing region above the devices 112 (including light sensing devices) and are adapted to enhance the light absorption. In some embodiments, when the microstructures 130b are located in the light sensing regions, the micro lens (not shown) may be disposed above and adjacent to the microstructures 130b or on the microstructures 130b. In some embodiments, the layout of the wiring structure 120 or the patterns of the metal interconnection patterns 124, 126, 128 are arranged aside of the light sensing region(s) or away from the light sensing region(s) (from the top view), and are not directly above the devices 112, so as not to obstruct light from reaching the light sensing regions.

Figure 7:
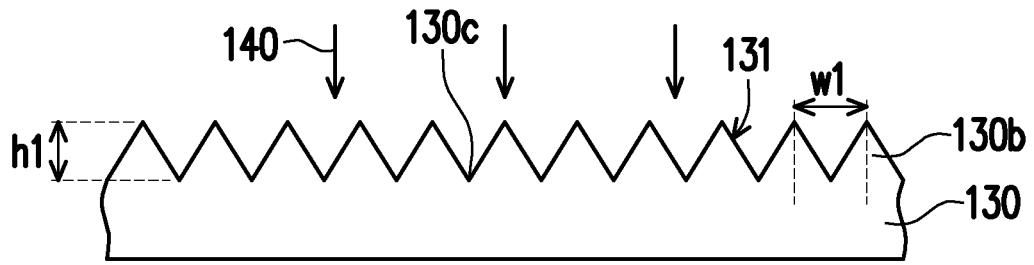
FIG. 7 is an enlarged partial schematic cross sectional view of a passivation layer of a semiconductor device structure of FIG. 6.
Figure 8:
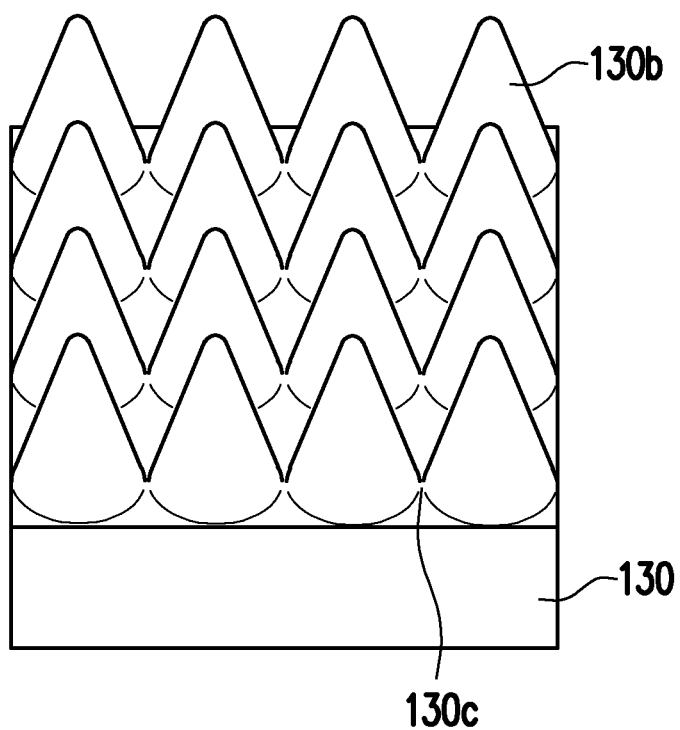
FIG. 8 is a tilted top view of the passivation layer of FIG. 7.

FIG. 7 is an enlarged schematic cross sectional view of a passivation layer of a semiconductor device structure of FIG. 6. FIG. 8 is a tilted top view of the passivation layer of FIG. 7. Referring to FIG. 7 to FIG. 8, in some embodiments, each microstructure 130b is formed with a cross-section shape of, for example, a triangle. However, in other embodiments, a cross-section shape of each microstructure 130b is, for example, a trapezoid or arc, such as semi-circle or semi-ellipse (not shown). It is not limited that each of the microstructures has to have exactly the same shape and there may be certain variations of shapes among the microstructures. Furthermore, in certain embodiments, the shape of the microstructure 130b is a cone shape as shown in FIG. 8. The shape of the microstructure 130b may be a right pyramid shape, a triangular pyramid shape or any other suitable shape. FIG. 8 is a partial schematic view of the passivation layer 130. From FIG. 8, the microstructures 130b are formed regularly with the same shape, dimension and pitch and are arranged in an array. In some other embodiments, the microstructures 130b may be formed with different shapes, dimensions, pitches or patterns. The arrangement of the microstructures 130b depends on user requirements or product designs. In addition, as seen in FIG. 7 to FIG. 8, the formed microstructures 130b do not extend through the entire thickness of the passivation layer 130. The ratio of the height of the microstructures 130b to the thickness of the remained passivation layer 130 that is not formed into parts of the microstructures 130b is adjustable. In other embodiments, the microstructures 130b can be formed extending through the entire thickness of the passivation layer 130 such that the height of the microstructures 130b is substantially equivalent to the entire thickness or height of the passivation layer 130. The shape, configuration or dimension of the microstructures 130*b* may be changed depending on, for example, the material of the passivation layer 130 or the wavelength(s) of incident light that is to be detected or sensed.

Further referring to FIG. 7 to FIG. 8, in some embodiments, the microstructures 130*b* are formed with the arrangement that any two most adjacent ones of the microstructures 130*b* are abutting with each other and the peripheries of the bases 130*c* of adjacent microstructures 130*b* are in direct contact with each other. The microstructure 130*b* has a height h1, and a pitch w1 between any two most adjacent ones of the microstructures 130*b*. In some embodiments, the height h1 is between 100λ and λ/100, and the pitch w1 is between 100λ and λ/100, λ representing a wavelength of an incident light 140. In some embodiments, the height h1 is greater than λ/2.5, and the pitch w1 is greater than λ/2. With the microstructures 130*b*, a larger top surface area for receiving the incident light 140 is provided for multiple reflection, and an incident angle of the incident light 140 projected to the surface 131 of the microstructures 130*b* is smaller than that of the incident light 140 projected to a flat surface of the passivation layer 130, so that most of the incident light 140 can pass through the microstructures 130 to be sensed by the devices 112. The reflection loss of the incident light 140 is reduced because the incident light 140 is multiply reflected and refracted by the microstructures 130*b* and the reflection loss ratio keeps decreasing after multiple reflections and refractions within the microstructures 130*b*. Hence, the absorption ratio of the incident light 140 is significantly raised. Furthermore, the light beam of the incident light 140 is narrowed by the designed multiple reflections from the microstructures 130*b*.

Figure 9:
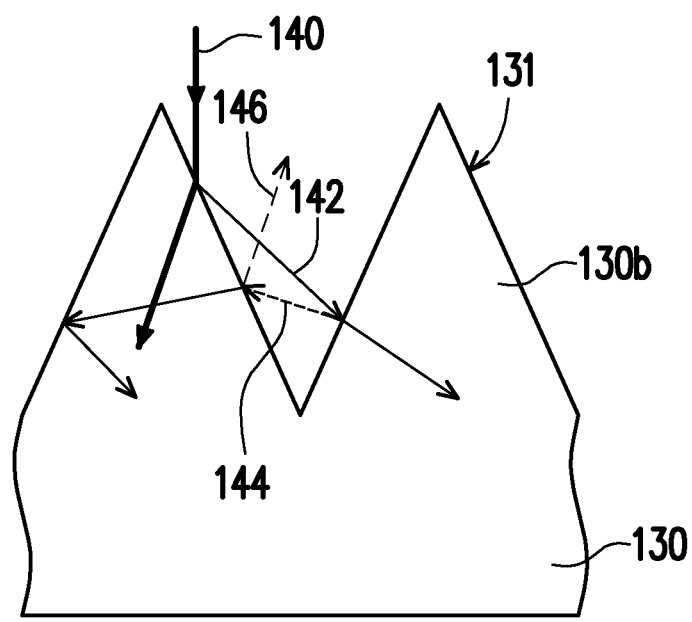
FIG. 9 is an enlarged partial schematic cross sectional view of the passivation layer of FIG. 7.

FIG. 9 is an enlarged partial schematic cross sectional view of the passivation layer of FIG. 7. Specifically, as seen in FIG. 9, in some embodiments, the incident light 140 is incident on the microstructure 130*b* so that part of the incident light 140 is refracted into and passes through the microstructure 130*b* and part of the incident light 140 is reflected off the microstructure 130*b* to become a first reflected light 142. The first reflected light 142 is then incident on an adjacent microstructure 130*b* such that a portion of the first reflected light 142 is refracted into and passes through the adjacent microstructure 130*b* and a portion of the first reflected light 142 is reflected off the adjacent microstructure 130*b* to become a second reflected light 144. The second reflected light 144 is then incident on the same microstructure 130*b* the incident light 140 was incident to, such that a portion of the second reflected light 144 is refracted into and passes through the microstructure 130*b* and a portion of the second reflected light 144 is reflected off the microstructure 130*b* to become a third reflected light 146. The third reflected light 146 is reflected in a direction away from the microstructures 130*b* such that the light is lost. In certain embodiments, the incident light 140 refracted multiple times into the microstructures 130*b* is absorbed by the underlying light sensing device. In some embodiments, the incident light 140 is also reflected multiple times to become the first, second and third reflected light 142, 144, 146 with decreasing reflection ratios. In exemplary embodiments, when the microstructures 130*b* are made of silicon nitride (refraction index of 2.4), the incident light 140 from air (refraction index of 1.0) is also reflected multiple times to become the first, second and third reflected light 142, 144, 146 with reflection ratios of 0.169 (16.9%), 0.029 (2.9%) and 0.005 (5%). As the incident light 140 is reflected multiple times, the amount of light lost is reduced to only 5% of the third reflected light 146, which is significantly lower than that of the first reflected light 142 (if the incident light 140 was only refracted and reflected once and lost). That is to say, only 5% of the incident light 140 was lost, and 95% of the incident light 140 passes through the microstructures 130*b* of the passivation layer 130 to be sensed or absorbed by the devices 112. The reflection paths of the incident light 140, the first reflected light 142, the second reflected light 144, and the third reflected light 146 described in the drawings are exemplary, as the reflection/refraction paths and the transmission/reflection rates of the light may vary depending on the incident angle and the indexes of refraction of the materials at the interface (reflection law and Snell's law). The material of the microstructures 130*b* and the incident angle of the incident light 140 affect the light reflection/refraction paths. The aforementioned light path is merely exemplary to show that the microstructures 130*b* allow the absorption ratio of the incident light 140 to be significantly raised. In addition, through the microstructures 130*b* the beam width of the incident light 140 is also narrowed.

Figure 10:
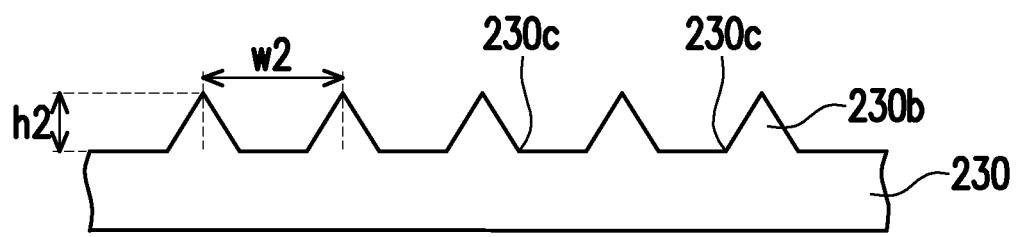
FIG. 10 is an enlarged schematic cross sectional view of a passivation layer of a semiconductor device structure according to some exemplary embodiments of the present disclosure.

FIG. 10 is an enlarged schematic cross sectional view of a passivation layer of a semiconductor device structure according to some exemplary embodiments of the present disclosure. Referring to FIG. 10, the passivation layer 230 with the microstructures 230*b* is adapted to be formed on the semiconductor device structure 100 in FIG. 6. The difference between the passivation layer 230 and the passivation layer 130 in FIG. 6 is that in the passivation layer 230, in the operation of forming the microstructures 230*b*, the bases 230*c* of any two most adjacent ones of the microstructures 230*b* are separated from each other. That is to say, the bases 230*c* of the microstructures 230*b* are not adjoined. As shown in FIG. 10, each microstructure 230*b* has a height h2, and a pitch w2 is formed between any two adjacent ones of the microstructures 230*b*. In some embodiments, the height h2 is between 100λ and λ/100, and the pitch w2 is between 100λ and λ/100. In some embodiments, the height h2 is greater than λ/2.5, and the pitch w2 is greater than 212. The microstructures 230*b* are not adjoined based on user requirements. Similar to the microstructures 130*b* in FIG. 7, the microstructures 230*b* in FIG. 10 also allow an incident light (not shown) to be multiply refracted, and then pass through to be absorbed by the devices 112. Hence, the absorption ratio of the incident light is significantly raised. In addition, through the microstructures 230*b* the beam width of the incident light is also narrowed. An incident light is not shown in FIG. 10 as a similar light path can be referred to in FIG. 7.

Figure 11:
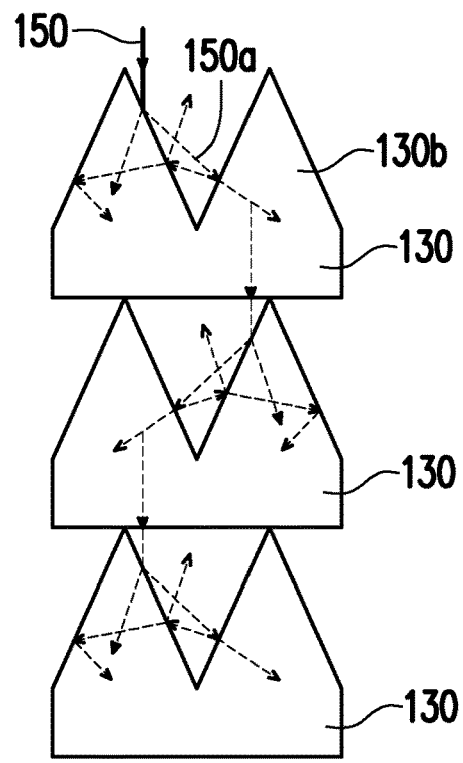
FIG. 11 is an enlarged partial schematic cross sectional view of a plurality of passivation layers of a semiconductor device structure according to some exemplary embodiments of the present disclosure.

FIG. 11 is an enlarged partial schematic cross sectional view of a plurality of passivation layers of a semiconductor device structure according to some exemplary embodiments of the present disclosure. Referring to FIG. 11, FIG. 11 shows a plurality of passivation layers 130 stacked on top of each other. The passivation layers 130 are the same as the passivation layer 130 shown in FIG. 6 and FIG. 7. That is to say, in the embodiment of FIG. 11, additional passivation layers 130 are formed on the single passivation layer 130 shown in FIG. 6, and the embodiment is applicable to the semiconductor device structure shown in FIG. 6. FIG. 11 only shows two of the microstructures 130*b* on each of the passivation layers 130 as a partial schematic view. As seen in FIG. 11, in some embodiments, a total of three passivation layers 130 with the microstructures 130*b* are shown. However, the disclosure is not limited thereto, and the number of passivation layers 130 may be adjusted according to user requirements. The additional passivation layers 130 are formed layer by layer similar to the description of the formation of the passivation layer 130 in FIG. 6. That is to say, the photolithography process and the etching process are performed during each formation of the microstructures 130b of the passivation layers 130. The microstructures 130b of one passivation layer 130 are formed first, and then another passivation layer 130 is deposited and patterned to form the microstructures 130b on the additional passivation layer 130. As seen in FIG. 11, in some embodiments, the microstructures 130b of each passivation layer 130 are aligned with each other in a stacking direction of the passivation layer 130. To be specific, as seen in FIG. 11, the microstructures 130b of each passivation layer 130 are aligned in a vertical direction. With this configuration, the microstructures 130b of the stacked passivation layers 130 allow an incident light 150 to be multiply refracted, and then pass through to be absorbed by the devices 112. Hence, the absorption ratio of the incident light 150 is significantly raised. Specifically, similar to the light path of the incident light 140 in FIG. 7, the incident light 150 also reflected and refracted multiple times as shown in the light path 150a of the incident light 150. Furthermore, as the incident light 150 passes through the microstructures 130b of the stacked passivation layers 130, the light beam of the incident light 150 is further narrowed such that the stacked passivation layers 130 are a stacked optical collimator.

Figure 12:
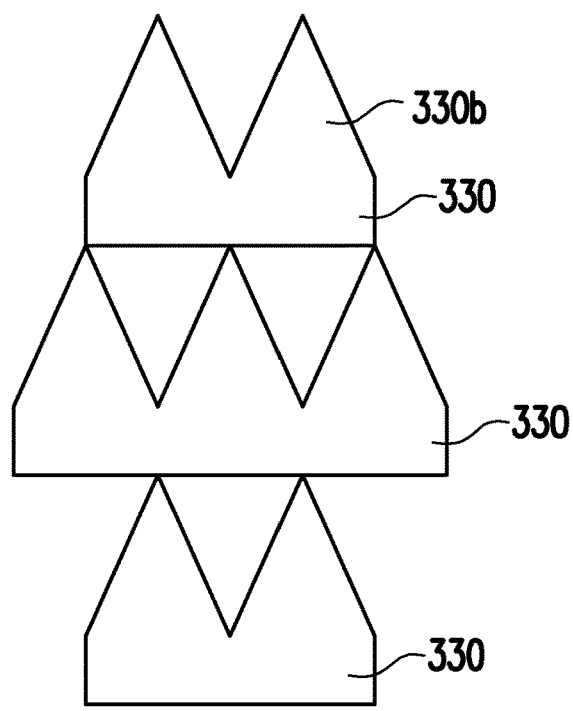
FIG. 12 is an enlarged partial schematic cross sectional view of a plurality of passivation layers of a semiconductor device structure according to some exemplary embodiments of the present disclosure.

FIG. 12 is an enlarged partial schematic cross sectional view of a plurality of passivation layers of a semiconductor device structure according to some exemplary embodiments of the present disclosure. Referring to FIG. 12, the embodiment of FIG. 12 is similar to the embodiment of FIG. 11, and the same description is not repeated herein. The difference between the embodiment of FIG. 12 and the embodiment of FIG. 11 is that in the embodiment of FIG. 12, the microstructures 330b of each passivation layer 330 are alternately aligned with each other in a stacking direction of the passivation layer 330. To be specific, as seen in FIG. 12, the microstructures 330b of each passivation layer 330 are alternately aligned in a vertical direction such that a microstructure 330b of a passivation layer 330 is between two adjacent microstructures 330b in the above passivation layer 330. Similar to the embodiment of FIG. 11, the stacked passivation layers 330 of FIG. 12 narrow an incident light beam (not shown) to be a stacked optical collimator. In the embodiments of FIG. 11 and FIG. 12, the microstructures 230b of FIG. 10 may also be applied. Furthermore, the microstructures in FIG. 11 and FIG. 12 may be any suitable shape or arrangement on each passivation layer. The disclosure is not limited thereto.

Figure 13:
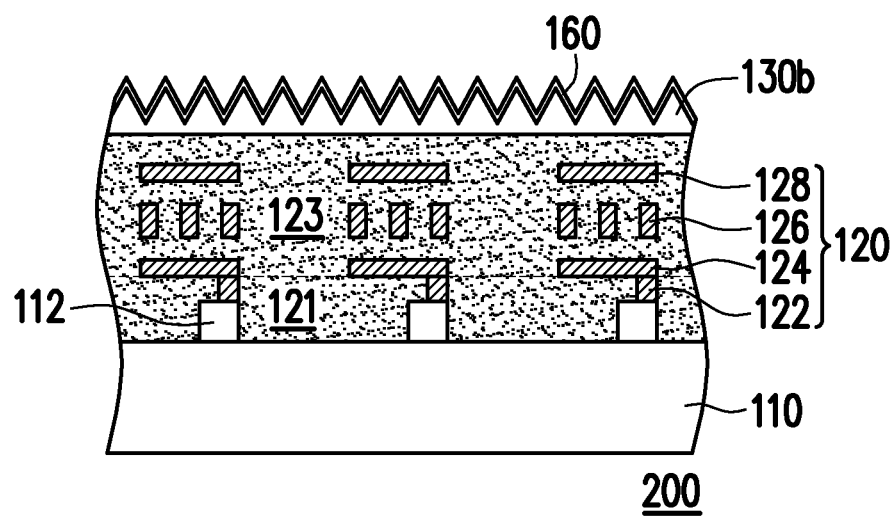
FIG. 13 is a schematic cross section view of a semiconductor device structure according to some exemplary embodiments of the present disclosure.

FIG. 13 is a schematic cross section view of a semiconductor device structure according to some exemplary embodiments of the present disclosure. Referring to FIG. 13, a semiconductor device structure 200 is similar to the semiconductor device structure 100 in FIG. 6. Similar elements are referenced with the same reference numerals. The same description is not repeated herein. The difference is that the semiconductor device structure 200 further includes an antireflective layer 160. The antireflective layer 160 is coated on the microstructures 130b after the microstructures 130b are formed. The antireflective layer 160 further reduces that amount of light that is reflected. That is to say, the antireflective layer 160 improves the absorption ratio of the incident light, and reduces the amount of incident light lost to reflection. In the embodiments, of FIG. 11 and FIG. 12, the antireflective layer 160 may also be coated on the topmost passivation layer 130, 230 of the stacked passivation layers 130, 230. Of course, the antireflective layer 160 may also be omitted is desired by the user. A material of the antireflective layer 160 is, for example, magnesium fluoride fluoropolymers, or any other suitable material. In addition, in the embodiments of FIGS. 10, 11, 12, and 13, the microstructures formed can extend through the entire thickness of the passivation layer 130 such that the height of the microstructures 130b is the entire thickness or height of the passivation layer 130. The parameters of the microstructures formed may depend on the material of the passivation layer or the configuration of the semiconductor device structure.

According to some embodiments, a semiconductor device structure for sensing an incident light includes a substrate, a wiring structure, and at least one passivation layer. The substrate has a light sensing device. The at least one passivation layer is disposed above the wiring structure. The at least one passivation layer includes a plurality of microstructures disposed above the light sensing device, and each of the microstructures has a cross-section in a shape of a triangle, trapezoid or arc. The wiring structure is disposed below the at least one passivation layer.

According to some embodiments, a method for manufacturing a semiconductor device structure includes the following steps. A substrate having a device is provided. A wiring structure is formed on the substrate. A passivation layer is formed on the wiring structure. A plurality of microstructures are formed from the passivation layer, and each of the microstructures has a cross-section in a shape of a triangle, trapezoid or arc.

According to some embodiments, a method for manufacturing a semiconductor device structure includes the following steps. A substrate having a device is provided. A wiring structure is formed on the substrate. A plurality of passivation layers are formed on the wiring structure. A plurality of microstrucutres are formed from at least two passivation layers of the passivation layers. The microstructures formed from the at least two passivation layers are stacked on top of each other. Each of the microstructures has a cross-section in a shape of a triangle, trapezoid or arc.

According to some embodiments, a semiconductor device structure for sensing an incident light includes a substrate, a passivation layer and a wiring structure. The substrate has a device embedded therein. The passivation layer is disposed on the substrate, wherein the passivation layer has a first side and a second side opposite to the first side, the first side of the passivation layer includes a plurality of microstructures disposed on the substrate, and the second side of the passivation layer is a continuous flat plane, wherein each of the microstructures has a cross-section in a shape of a triangle, trapezoid or arc. The wiring structure is disposed on the substrate, wherein the writing structure includes at least one contact and metal interconnection patterns respectively formed in different dielectric layers, and the at least one contact and the metal interconnection patterns are electrically connected, wherein the substrate is located between the passivation layer and the wiring structure.

According to some embodiments, a semiconductor device structure for sensing an incident light includes a substrate, a passivation layer and a wiring structure. The substrate has at least one light sensing region with a light sensing device formed therein. The passivation layer is disposed on the substrate, wherein a first side of the passivation layer includes a plurality of microstructures covering the substrate and overlapped with the at least one light sensing region, and a second side of the passivation layer is a continuous flat plane, wherein the first side is opposite to the second side, and each of the microstructures has a cross-section in a shape of a triangle, trapezoid or arc. The wiring structure is disposed on the substrate, wherein the writing structure includes at least one contact and metal interconnection patterns respectively formed in different dielectric layers, and the at least one contact and the metal interconnection patterns are electrically connected, wherein the substrate is located between the passivation layer and the wiring structure.

According to some embodiments, a method for manufacturing a semiconductor device structure includes the following steps, providing a substrate having a device embedded therein; forming a wiring structure comprising at least one contact and metal interconnection patterns respectively formed in different dielectric layers on the substrate, wherein the at least one contact and the metal interconnection patterns are electrically connected; and forming a passivation layer having microstructures on the substrate, a first side of the passivation layer comprising the microstructures, a second side of the passivation layer being a continuous flat plane and opposite to the first side, wherein each of the microstructures has a cross-section in a shape of a triangle, trapezoid or arc, and the substrate is located between the passivation layer and the wiring structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure for sensing an incident light, comprising:
   a substrate having a device embedded therein;
   a first passivation layer, disposed on the substrate, wherein the first passivation layer has a first side and a second side opposite to the first side, the first side of the first passivation layer comprises a plurality of first microstructures disposed on the substrate, and the second side of the first passivation layer is a continuous flat plane, wherein each of the plurality of first microstructures has a cross-section in a shape of a triangle, trapezoid or arc;
   a second passivation layer, disposed on the substrate, wherein the first passivation layer is sandwiched between the substrate and the second passivation layer, wherein there is a cavity confined by the first passivation layer and the second passivation layer; and
   a wiring structure, disposed on the substrate and electrically coupled to the device, wherein the substrate is located between the first passivation layer and the wiring structure.

2. The semiconductor device structure as claimed in claim 1, wherein the cavity is in direct contact with the second side of the first passivation layer.

3. The semiconductor device structure as claimed in claim 1, wherein the second passivation layer has a third side and a fourth side opposite to the third side, the third side of the second passivation layer comprises a plurality of second microstructures prop against the second side, and the fourth side of the second passivation layer is a continuous flat plane, wherein each of the plurality of second microstructures has a cross-section in a shape of a triangle, trapezoid or arc,
   wherein the cavity is laterally surrounded by the plurality of second microstructures.

4. The semiconductor device structure as claimed in claim 3, wherein the plurality of first microstructures independently has a first peak, the plurality of second microstructures independently has a second peak, and the first peaks are not aligned with the second peaks along a stacking direction of the substrate and the wiring structure.

5. The semiconductor device structure as claimed in claim 3, wherein the plurality of first microstructures independently has a first peak, the plurality of second microstructures independently has a second peak, and the first peaks are respectively aligned with the second peaks along a stacking direction of the substrate and the wiring structure.

6. The semiconductor device structure as claimed in claim 3, wherein the second surface is in physically contact with the third surface.

7. The semiconductor device structure as claimed in claim 3, wherein the second passivation layer includes a plurality of second passivation layers, at least two second passivation layers of the plurality of second passivation layers have the plurality of second microstructures, and the plurality of second microstructures of the at least two second passivation layers are stacked on top of each other.

8. The semiconductor device structure as claimed in claim 1, wherein the first passivation layer includes a plurality of first passivation layers, at least two first passivation layers of the plurality of first passivation layers have the plurality of first microstructures, and the plurality of first microstructures of the at least two first passivation layers are stacked on top of each other.

9. The semiconductor device structure as claimed in claim 1, further comprising:
   an antireflective layer, coated on the first passivation layer and overlapped with the plurality of first microstructures.

10. The semiconductor device structure as claimed in claim 1, further comprising:
    micro lens, arranged into an array and over the plurality of first microstructures of the first passivation layer.

11. A semiconductor device structure for sensing an incident light, the semiconductor device structure comprising:
    a substrate having a light sensing device;
    a wiring structure, disposed over the substrate and electrically coupled to the light sensing device; and
    passivation layers, disposed above the substrate, wherein there is a cavity confined by two adjacent passivation layers of the passivation layers along a stacking direction of the substrate and the wiring structure, and wherein the passivation layers comprises a plurality of microstructures, and each of the plurality of microstructures has a cross-section in a shape of a triangle, trapezoid or arc.

12. The semiconductor device structure as claimed in claim 11, wherein the wiring structure is disposed between the substrate and the passivation layers.

13. The semiconductor device structure as claimed in claim 11, wherein the cavity is in direct contact with the two adjacent passivation layers of the passivation layers.

14. The semiconductor device structure as claimed in claim 11, wherein the cavity has a cross-section in a shape of a triangle, trapezoid or arc, and the cavity is laterally surrounded by a portion of the plurality of microstructures.

15. The semiconductor device structure as claimed in claim 11, further comprising:
an antireflective layer, coated on the plurality of microstructures of a topmost passivation layer of the passivation layers.

16. The semiconductor device structure as claimed in claim 11, further comprising:
micro lens, arranged into an array and on the plurality of microstructures of a topmost passivation layer of the passivation layers.

17. A semiconductor device structure for sensing an incident light, comprising:
a substrate having a first surface and a second surface opposite to the first surface, the substrate comprising a device embedded therein near the first surface;
a wiring structure, disposed on the first surface of the substrate and electrically coupled to the device;
a first passivation layer, disposed at the second surface of the substrate, wherein the first passivation layer has a first base and a plurality of first microstructures disposed on the first base, and each of the plurality of first microstructures has a cross-section in a shape of a triangle, trapezoid or arc, wherein the second surface of the substrate is meshed with the plurality of first microstructures; and
a second passivation layer, disposed on the first passivation layer, wherein the first passivation layer is between the second passivation layer and the substrate, wherein the first base is sandwiched between the plurality of first microstructures and the second passivation layer, wherein there is a cavity confined by the first passivation layer and the second passivation layer.

18. The semiconductor device structure as claimed in claim 17, wherein the second surface of the substrate has a topography engaged with a topography of the plurality of first microstructures.

19. The semiconductor device structure as claimed in claim 17, further comprising:
an antireflective layer, coated on the plurality of first microstructures of the first passivation layer, wherein the antireflective layer is disposed between the plurality of first microstructures and the substrate.

20. The semiconductor device structure as claimed in claim 17, further comprising:
micro lenses, arranged into an array and over the plurality of first microstructures of the first passivation layer, wherein the second passivation layer is between the first passivation layer and the micro lenses.

* * * * *